United States Patent
Zhou et al.

(10) Patent No.: US 11,251,368 B2
(45) Date of Patent: Feb. 15, 2022

(54) INTERCONNECT STRUCTURES WITH SELECTIVE CAPPING LAYER

(71) Applicant: International Business Machines Corporation, Armonk, NY (US)

(72) Inventors: Tianji Zhou, Albany, NY (US); Saumya Sharma, Albany, NY (US); Ashim Dutta, Menands, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 16/852,997

(22) Filed: Apr. 20, 2020

(65) Prior Publication Data
US 2021/0328137 A1 Oct. 21, 2021

(51) Int. Cl.
*H01L 43/12* (2006.01)
*H01L 27/22* (2006.01)
*H01L 43/02* (2006.01)

(52) U.S. Cl.
CPC .......... *H01L 43/12* (2013.01); *H01L 27/222* (2013.01); *H01L 43/02* (2013.01)

(58) Field of Classification Search
CPC ........ H01L 43/12; H01L 43/02; H01L 27/222
USPC ........................................................ 257/421
See application file for complete search history.

(56) References Cited

U.S. PATENT DOCUMENTS

| | | | |
|---|---|---|---|
| 6,153,935 A | 11/2000 | Edelstein et al. | |
| 6,709,874 B2 * | 3/2004 | Ning | H01L 21/7684 |
| | | | 257/E21.583 |
| 7,064,064 B2 | 6/2006 | Chen et al. | |
| 7,211,849 B2 | 5/2007 | Hineman et al. | |
| 7,259,463 B2 | 8/2007 | Huang et al. | |
| 7,855,143 B2 | 12/2010 | Liu et al. | |
| 7,928,570 B2 | 4/2011 | Ponoth et al. | |
| 8,569,165 B2 | 10/2013 | Gordon et al. | |
| 9,390,971 B2 | 7/2016 | Gordon et al. | |
| 9,947,547 B2 | 4/2018 | Mont et al. | |
| 2002/0096775 A1 * | 7/2002 | Ning | H01L 21/7685 |
| | | | 257/763 |
| 2019/0139887 A1 | 5/2019 | Lin et al. | |

* cited by examiner

*Primary Examiner* — Tu-Tu V Ho
(74) *Attorney, Agent, or Firm* — L. Jeffrey Kelly; Ryan, Mason & Lewis, LLP (57) ABSTRACT

A method includes forming a first metallization layer containing a first metal-containing line and a second metal-containing line disposed in a first interlevel dielectric layer. The first metal-containing line includes a first conductive metal and the second metal-containing line includes a second conductive metal. The first metal-containing line and the second metal-containing line are recessed to below a top surface of the interlevel dielectric layer. A metal-containing cap protection layer is deposited in a recessed portion of the first metal-containing line and the second metal-containing line. The metal-containing cap protection layer includes a third conductive metal which is different than the first conductive metal and the second conductive metal.

20 Claims, 8 Drawing Sheets

INTERCONNECT STRUCTURES WITH SELECTIVE CAPPING LAYER

BACKGROUND

With the current trends in integrated circuit (IC) miniaturization, and increasingly smaller critical dimensions, it is desirable in semiconductor device technology to integrate many different functions on a single chip. In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

SUMMARY

Illustrative embodiments of the present application include techniques for use in semiconductor manufacture. In one illustrative embodiment, a method comprises forming a first metallization layer comprising a first metal-containing line and a second metal-containing line disposed in a first interlevel dielectric layer. The first metal-containing line comprises a first conductive metal and the second metal-containing line comprises a second conductive metal. The method further comprises recessing the first metal-containing line and the second metal-containing line to below a top surface of the interlevel dielectric layer. The method further comprises depositing a metal-containing cap protection layer in a recessed portion of the first metal-containing line and the second metal-containing line. The metal-containing cap protection layer comprises a third conductive metal which is different than the first conductive metal and the second conductive metal.

In another illustrative embodiment, a semiconductor structure comprises a first metallization layer comprising a recessed first metal-containing line and a recessed second metal-containing line disposed in a first interlevel dielectric layer. The first metal-containing line comprises a first conductive metal and the second metal-containing line comprises a second conductive metal. The semiconductor structure further comprises a metal-containing cap protection layer disposed in a recessed portion of the first metal-containing line and the second metal-containing line. The metal-containing cap protection layer comprises a third conductive metal which is different than the first conductive metal and the second conductive metal.

In another illustrative embodiment, an integrated circuit comprises one or more semiconductor structures. At least one of the one or more semiconductor structure comprises a first metallization layer comprising a recessed first metal-containing line and a recessed second metal-containing line disposed in a first interlevel dielectric layer. The first metal-containing line comprises a first conductive metal and the second metal-containing line comprises a second conductive metal. The semiconductor structure further comprises a metal-containing cap protection layer disposed in a recessed portion of the first metal-containing line and the second metal-containing line. The metal-containing cap protection layer comprises a third conductive metal which is different than the first conductive metal and the second conductive metal.

Other embodiments will be described in the following detailed description of embodiments, which is to be read in conjunction with the accompanying figures.

DETAILED DESCRIPTION

This disclosure relates generally to integrated circuits (IC), and more particularly to semiconductor ICs, and methods for their construction.

Exemplary embodiments of the invention will now be discussed in further detail with regard to interconnect structures on a BEOL structure of an integrated circuit having a selective capping layer. In general, during magnetic random-access memory (MRAM) device patterning, an ion beam etch (IBE) is used which removes or provides a relatively thin layer of a lower level interconnect cap layer. The interconnect metal (e.g., Cu) can then diffuse from the trench thereby causing delamination or even shorting between levels. Thus, it is highly desirable to protect the interconnect metal during patterning of the MRAM device so that the interconnect metal is not exposed after the IBE is completed. Accordingly, illustrative embodiments provide a semiconductor structure having a selective cap layer on the interconnect metal. By forming such a structure, the interconnect metal is protected to avoid any delamination and shorting between levels.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Illustrative embodiments for fabricating top via interconnects will be described below with reference to FIGS. 1-16. Note that the same reference numeral (100) is used to denote the semiconductor structure through the various intermediate fabrication stages illustrated in FIGS. 1-16. Note also that the semiconductor structure described herein can also be considered to be a semiconductor device and/or an integrated circuit, or some part thereof. For the purpose of clarity, some fabrication steps leading up to the production of the top via interconnects as illustrated in FIGS. 1-16 are omitted. In other words, one or more well-known processing steps which are not illustrated but are well-known to those of ordinary skill in the art have not been included in the figures.

Figure 1:
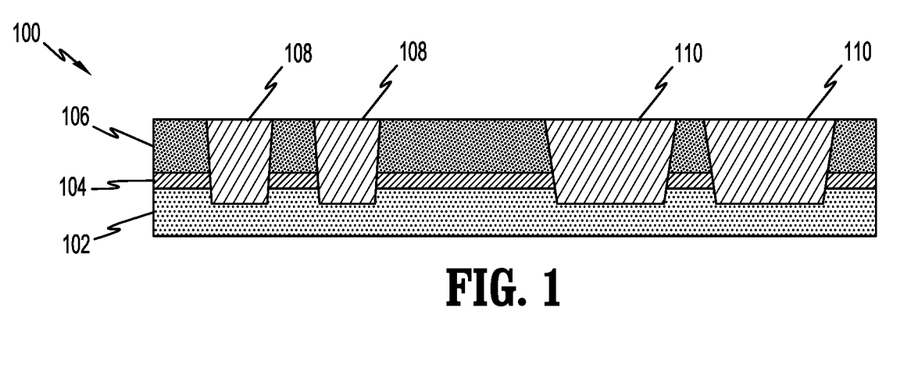
FIG. 1 is a schematic cross-sectional view of a semiconductor structure at a first-intermediate fabrication stage, according to an illustrative embodiment.

Referring now to FIG. 1, semiconductor structure 100 includes a first metallization layer (or level M1) which includes an insulating layer 102, a cap layer 104 disposed on insulating layer 102, an interlevel dielectric layer 106 disposed on cap layer 104 and a first set of metal-containing lines 108 disposed in interlevel dielectric (ILD) layer 106, cap layer 104 and a portion of insulating layer 102, and a second set of metal-containing lines 110 disposed in interlevel dielectric layer 106, cap layer 104 and a portion of insulating layer 102.

The first metallization layer is formed on a semiconductor substrate (not shown) which may comprise one of different types of semiconductor substrate structures and materials. For example, in one embodiment, the semiconductor substrate can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of an FEOL.

Insulating layer 102 may be made of any known dielectric material such as, for example, silicon oxide, silicon nitride, hydrogenated silicon carbon oxide, low-k dielectrics, ultralow-k dielectrics, flowable oxides, porous dielectrics, or organic dielectrics including porous organic dielectrics.

Low-k dielectric materials have a nominal dielectric constant less than the dielectric constant of $SiO_2$, which is approximately 4 (e.g., the dielectric constant for thermally grown silicon dioxide can range from 3.9 to 4.0). In one embodiment, low-k dielectric materials may have a dielectric constant of less than 3.7. Suitable low-k dielectric materials include, for example, fluorinated silicon glass (FSG), carbon doped oxide, a polymer, a SiCOH-containing low-k material, a non-porous low-k material, a porous low-k material, a spin-on dielectric (SOD) low-k material, or any other suitable low-k dielectric material. Ultra-low-k dielectric materials have a nominal dielectric constant less than 2.5. Suitable ultra-low-k dielectric materials include, for example, SiOCH, porous pSiCOH, pSiCNO, carbon rich silicon carbon nitride (C-Rich SiCN), porous silicon carbon nitride (pSiCN), boron and phosporous doped SiCOH/pSiCOH and the like. The insulating layer 102 may be formed by any suitable deposition technique known in the art, including atomic layer deposition (ALD), chemical vapor deposition (CVD), plasma enhanced chemical vapor deposition (PECVD), physical vapor deposition (PVD), molecular beam deposition (MBD), pulsed laser deposition (PLD), chemical solution deposition or other like processes.

Cap layer 104 can be any suitable capping material such as, for example, a dielectric material. In one embodiment, cap layer 104 is a dielectric such as a nitrogen and hydrogen doped silicon carbide (SiCN(H)) (also referred to as NBLoK) layer, a carbon doped silicon nitride layer, an aluminum nitride (AlN) layer, and a silicon nitride layer. Cap layer 104 may be conformally deposited using known methods such as, for example, ALD, CVD, PECVD, PVD, electroplating, or electroless plating. In one embodiment, cap layer 104 can have a thickness ranging from about 10 to about 100 nanometers (nm).

The ILD layer 106 includes, for example, any suitable dielectric material such as silicon oxide, silicon nitride, hydrogenated silicon carbon oxide, low-k dielectrics, ultra-low-k dielectrics, flowable oxides, porous dielectrics, or organic dielectrics including porous organic dielectrics. Suitable low-k dielectric and ultra-low-k dielectric materials include those discussed above. The ILD layer 106 may be formed using any suitable deposition techniques including CVD, ALD, PVD, PECVD, chemical solution deposition or other like processes. ILD layer 106 is then planarized by, for example, a planarization process such as a chemical mechanical planarization (CMP) process.

The first and second set of metal-containing lines 108 and 110 may be formed using an etch process using photolithography, etching and deposition processes. For example, in some embodiments, a pattern (not shown) is produced on interlevel dielectric layer 106 by applying a photoresist to the surface to be etched; exposing the photoresist to a pattern of radiation; and then developing the pattern into the photoresist utilizing resist developer. The etch process can be a directional etching such as reactive ion etching (RIE), and the excess resist from the lithography is stripped. The etching will form trenches (not shown) in interlevel dielectric layer 106, cap layer 104 and a portion of insulating layer 102. Next, a metal material as discussed below is deposited in the trenches to form metal-containing lines 108 and 110 using a suitable deposition process, for example, CVD, ALD, PVD, PECVD, or other like processes. Subsequently, any metal overburden is then planarized by, for example, a planarization process such as a CMP process.

The metal material for first and second set of metal-containing lines 108 and 110 can be any suitable conductive metal including, for example, copper (Cu), aluminum (Al), chromium (Cr), cobalt (Co), hafnium (Hf), iridium (Ir), molybdenum (Mo), niobium (Nb), osmium (Os), rhenium (Re), rhodium (Rh), ruthenium (Ru), tantalum (Ta), titanium (Ti), tungsten (W), vanadium (V), zirconium (Zr), and alloys thereof. In one embodiment, a conductive metal is Cu. The first and second set of metal-containing lines 108 and 110 may be formed of the same or different conductive metal.

Figure 2:
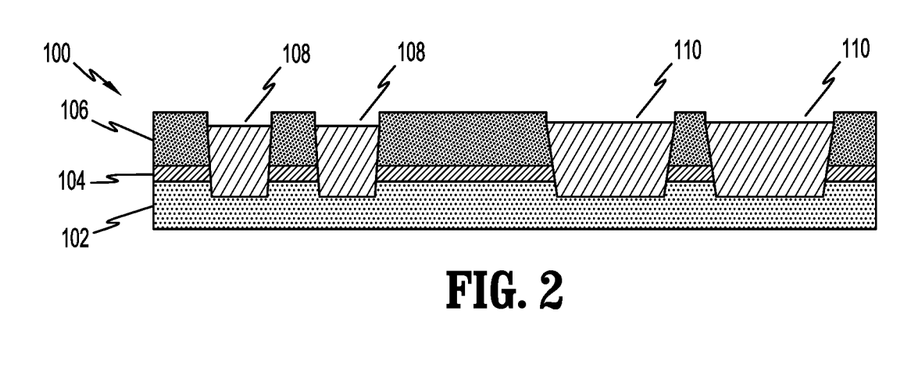
FIG. 2 is a schematic cross-sectional view of the semiconductor structure at a second-intermediate stage of fabrication, according to an illustrative embodiment.

FIG. 2 is a cross sectional view of the semiconductor structure 100 at a second-intermediate stage of fabrication. During this stage, the conductive metal in the first and second set of metal-containing lines 108 and 110 is recessed by carrying out a wet etch process such as an amino acid etch that is selective to the first and second set of metal-containing lines 108 and 110, and not ILD layer 106. In one illustrative embodiment, the conductive metal in the first and second set of metal-containing lines 108 and 110 is recessed from about 5 nm to about 20 nm.

Figure 3:
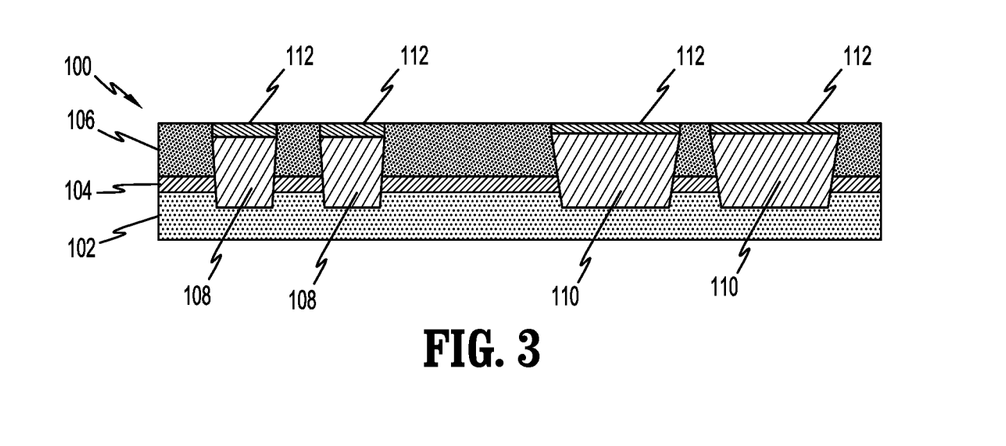
FIG. 3 is a schematic cross-sectional view of the semiconductor structure at a third-intermediate stage of fabrication, according to an illustrative alternative embodiment.

FIG. 3 is a cross sectional view of the semiconductor structure 100 at a third-intermediate stage of fabrication. During this stage, a metal-containing cap protection layer 112 is deposited in the recessed portion of the first and second sets of metal-containing lines 108 and 110. Suitable material for cap protection layer 112 includes, for example, a conductive metal different than the conductive metal for the first and second set of metal-containing lines 108 and 110. In one embodiment, a conductive metal is one or more of W, Co, Ru and Rh. The conductive metal for cap protection layer 112 is formed using a suitable deposition process, for example, CVD, ALD or other electroless plating process. Any metal overburden is then planarized by, for example, a planarization process such as a CMP process.

Figure 4:
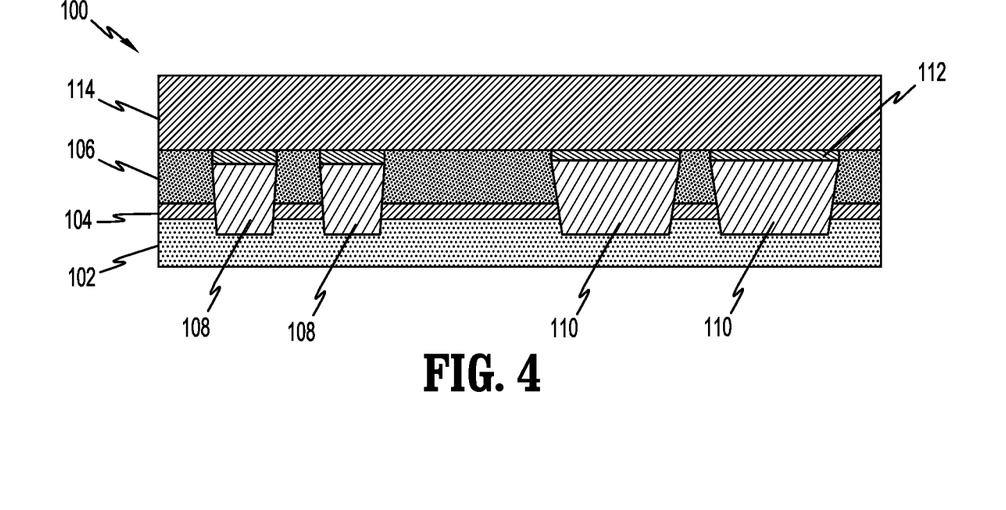
FIG. 4 is a schematic cross-sectional view of the semiconductor structure at a fourth-intermediate stage of fabrication, according to an illustrative embodiment.

FIG. 4 is a cross sectional view of the semiconductor structure 100 at a fourth-intermediate stage of fabrication. During this stage, cap layer 114 is deposited on interlevel dielectric layer 106 and cap protection layer 112. Cap layer 114 can be formed of a similar material and of a similar deposition process as discussed above for cap layer 104. In one embodiment, cap layer 114 can have a thickness ranging from about 10 nm to about 100 nm.

Figure 5:
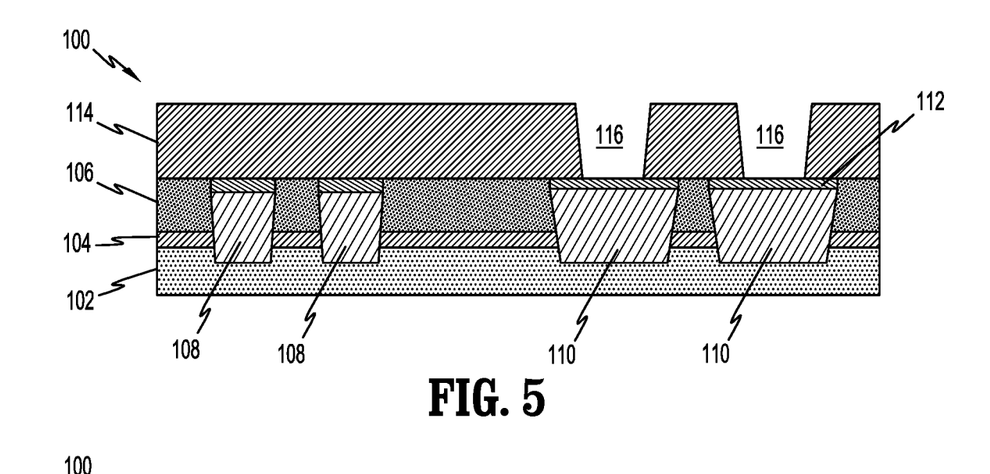
FIG. 5 is a schematic cross-sectional view of the semiconductor structure at a fifth-intermediate stage of fabrication, according to an illustrative embodiment.

FIG. 5 is a cross sectional view of the semiconductor structure 100 at a fifth-intermediate stage of fabrication. During this stage, cap layer 114 is selectively etched to form vias 116 and expose a portion of cap protection layer 112 disposed on the second set of metal-containing lines 110. For example, in some embodiments, a pattern (not shown) is produced on cap layer 114 by applying a photoresist to the surface to be etched; exposing the photoresist to a pattern of radiation; and then developing the pattern into the photoresist utilizing resist developer. The etch process can be a directional etching such as RIE, and the excess resist from the lithography is stripped. The etching will form the vias 116 in cap layer 114 and expose a portion of cap protection layer 112 on second set of metal-containing lines 110.

Figure 6:
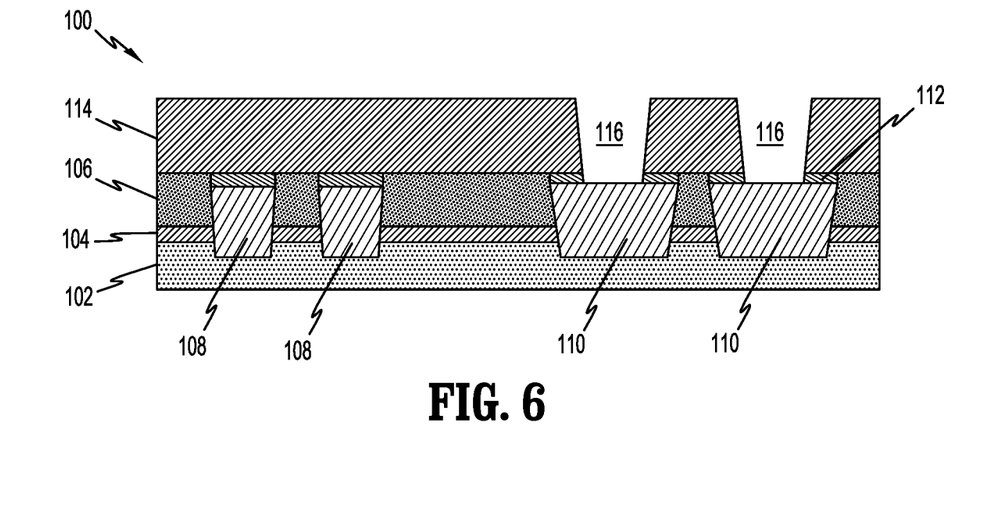
FIG. 6 is a schematic cross-sectional view of the semiconductor structure at sixth-intermediate stage of fabrication, according to an alternative illustrative embodiment.

FIG. 6 is a cross sectional view of the semiconductor structure 100 at an optional sixth-intermediate stage of fabrication. During this optional stage, the exposed cap protection layer 112 on the second set of metal-containing lines 110 can be selectively etched to expose the top surface of second set of metal-containing lines 110 and leave a portion of cap protection layer 112 under the cap layer 114. Cap protection layer 112 can be selectively etched using, for example, a suitable wet etching process.

Figure 7:
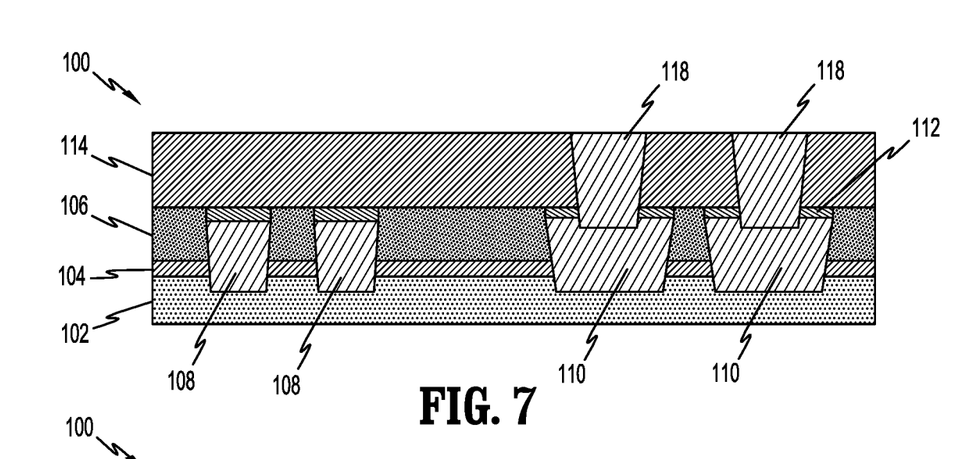
FIG. 7 is a schematic cross-sectional view of the semiconductor structure at a seventh-intermediate stage of fabrication, according to an illustrative embodiment.

FIG. 7 is a cross sectional view of the semiconductor structure 100 at a seventh-intermediate stage of fabrication. During this stage, a conductive metal is deposited in the vias 116 to form bottom electrodes 118 over the second set of metal-containing lines 110. A suitable conductive metal can be any of the conductive metals discussed above for the second set of metal-containing lines 110. In one embodiment, the conductive metal for bottom electrodes 118 is the same as the conductive metal of the second set of metal-containing lines 110. In one embodiment, the conductive metal is Cu. The conductive metal can be deposited using a deposition process as discussed above for the second set of metal-containing lines 110. Any metal overburden is then planarized by, for example, a planarization process such as a CMP process.

Figure 8:
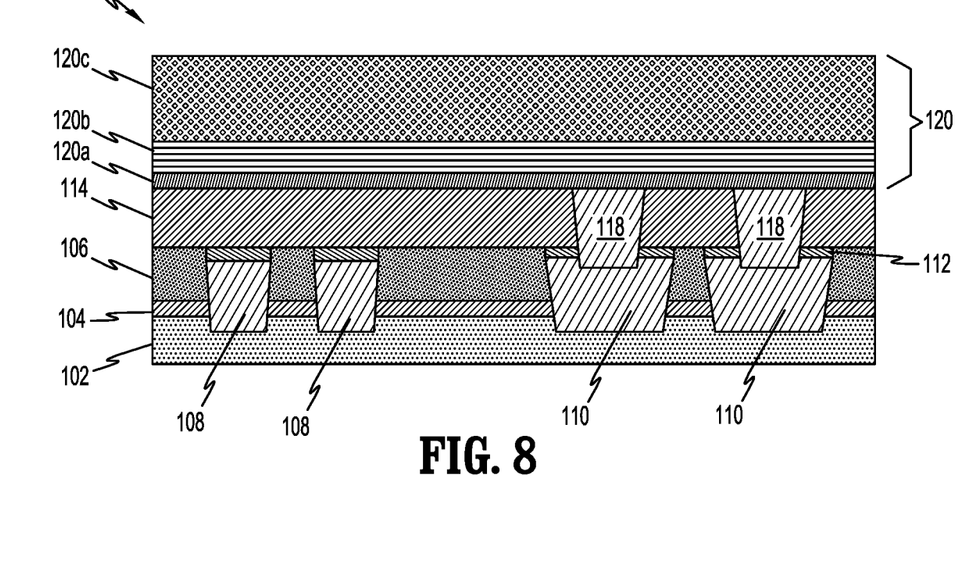
FIG. 8 is a schematic cross-sectional view of the semiconductor structure at an eighth-intermediate stage of fabrication, according to an illustrative embodiment.

FIG. 8 is a cross sectional view of the semiconductor structure 100 at an eighth-intermediate stage of fabrication. During this stage, a MRAM cell forming layer 120 is deposited over the top surface of semiconductor structure 100. The MRAM cell forming layer 120 disposed on the top surface of semiconductor structure 100 can be comprised of various layers in a stacked configuration. In one illustrative embodiment, MRAM cell forming layer 120 can include a conductive layer 120a, a magnetic tunnel junction (MTJ) stack 120b disposed on the conductive layer 120a and comprising a plurality of magnetic thin films with a tunnel barrier, and an electrically conductive mask 120c disposed on MTJ stack 120b. In one illustrative embodiment, conductive layer 120a can be, for example, one or more of Ta, W, Al, Ti, Ru, and their nitrides or alloys. The plurality of magnetic thin films for MTJ stack 120b includes, for example, cobalt, iron, nickel, cobalt alloy, iron alloy, nickel alloy, nitrides and oxides, e.g., Fe, CoFe, CoFeB, etc. A tunnel barrier includes, for example, tantalum, titanium, ruthenium, magnesium, aluminum, copper, tantalum alloy, titanium alloy, ruthenium alloy, magnesium alloy, aluminum alloy, copper alloy, and nitrides and oxides, e.g., MgO. Suitable material for electrically conductive mask 120c includes, for example, Nb, NbN, W, WN, Ta, TaN, Ti, TiN, Ru, Mo, Cr, V, Pd, Pt, Rh, Sc, Al and other high melting point metals or conductive metal nitrides. Other suitable configurations or materials of MRAM cell forming layer 120 may also be used.

Figure 9:
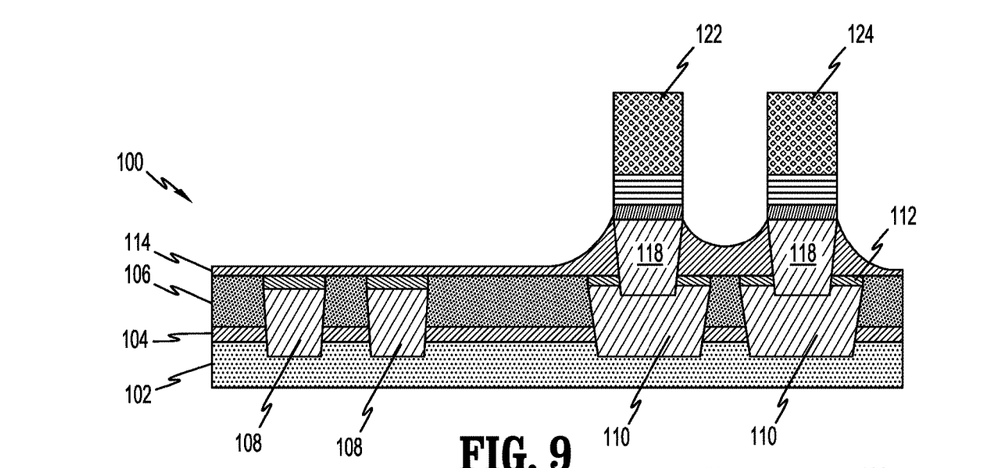
FIG. 9 is a schematic cross-sectional view of the semiconductor structure at a ninth-intermediate stage of fabrication, according to an illustrative embodiment.

FIG. 9 is a cross sectional view of the semiconductor structure 100 at a ninth-intermediate stage of fabrication. During this stage, MRAM cell forming layer 120 is selectively etched to form MRAM cells 122 and 124 over bottom electrodes 118. The MRAM cells 122 and 124 each have a conductive layer 120a, MTJ stack 120b and electrically conductive mask 120c. Although two MRAM cells and bottom electrodes are shown, one skilled in the art will appreciate that the structure 100 can contain one MRAM cell and bottom electrode or more than two MRAM cells and bottom electrodes. MRAM cells 122 and 124 are formed by selectively etching MRAM cell forming layer 120 using a suitable etching technique such as an ion beam etching (IBE) technique.

Ion beam etching employs sub-micron ion particles that are accelerated and bombard the surface of the target work. In addition, ion beam etching employs one or more noble inert gases, such as Ar, Xe, Ne or Kr, to enable physical etching or sputtering, which is distinguished from chemical etching, such as the chemical etching provided by reactive ion etch. Typically, during ion beam etching the work piece is mounted on a rotating table inside a vacuum chamber. Milling ions, e.g., argon ions, contained within plasma formed by an electrical discharge are accelerated by a pair of optically aligned grids. The highly collimated beam is focused on a tilted work plate that rotates during the milling operation.

As with other etching process, a selectively applied protectant, such as a photo sensitive resist (photoresist), may be applied to the work element, e.g., MRAM cell forming layer 120, prior to its introduction into the ion miller. The resist protects the underlying material, e.g., portion of the MRAM cell forming layer 120 that is present on the bottom electrode 118, during the ion beam etching process that removes the portion of the MRAM cell forming layer 120 that is exposed. In some embodiments, the milling ions, such as argon (Ar) ions, strike the target materials while they are rotated within the vacuum chamber to ensure uniform removal of waste material. This precision and its attendant repeatability are one strength of the collimated ion beam milling process.

During the etching process, cap layer 114 is also etched to a first and second portion. In one embodiment, a first portion of cap layer 114 over the first set of metal-containing lines 108 and adjacent ILD layer 106 is etched to a thin layer. For example, the etched cap layer 114 can have a thickness ranging from about 0 nm to about 20 nm or 1 nm to about 20 nm. In addition, a second portion of cap layer 114 is etched to surround bottom electrodes 118. In one embodiment, cap layer 114 is etched to a tapered form on one side of bottom electrode 118. Although cap layer 114 is shown in u-shaped form between adjacent bottom electrodes 118, any shape can be formed herein such as a planar form.

Figure 10:
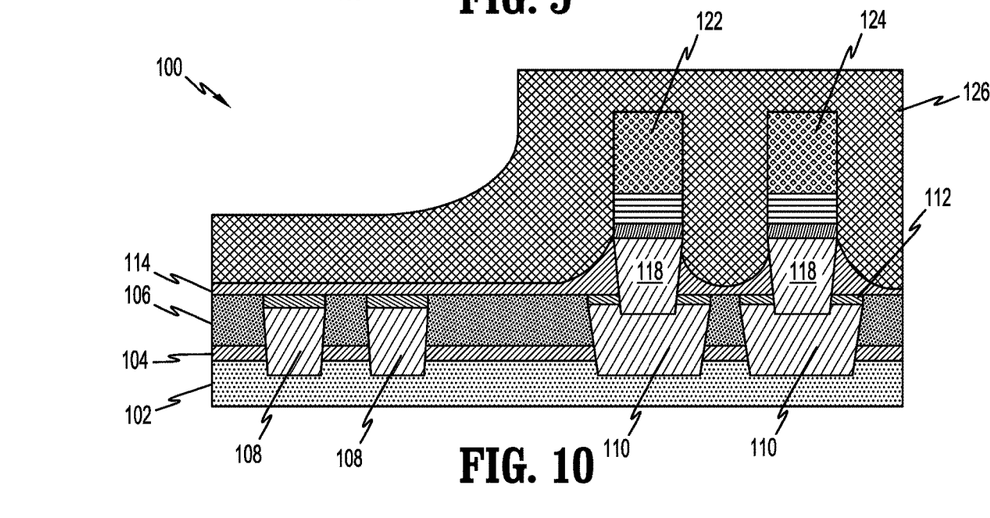
FIG. 10 is a schematic cross-sectional view of the semiconductor structure at a tenth-intermediate stage of fabrication, according to an illustrative embodiment.

FIG. 10 is a cross sectional view of the semiconductor structure 100 at a tenth-intermediate stage of fabrication. During this stage, a MRAM cell protection layer 126 is deposited on cap layer 114 and over MRAM cells 122 and 124 by a suitable deposition process such as, for example CVD, ALD, PVD, or other like processes. Suitable material for protection layer 126 includes, for example, SiN, SiC, and SiCN(H).

Figure 11:
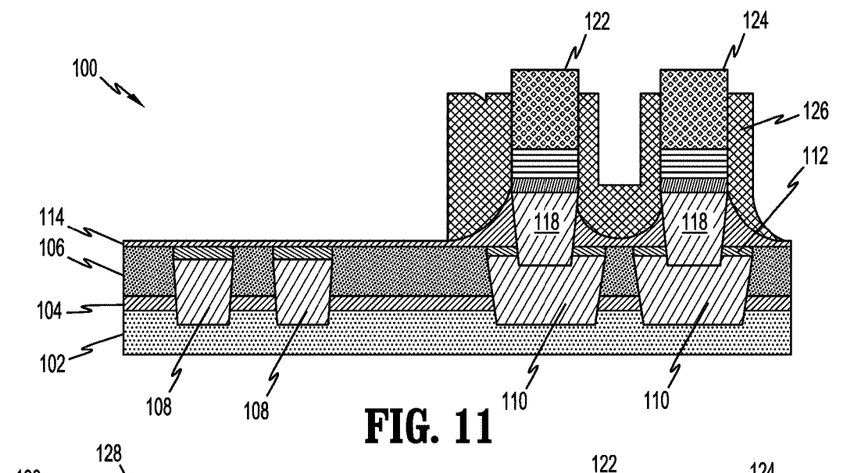
FIG. 11 is a schematic cross-sectional view of the semiconductor structure at an eleventh-intermediate stage of fabrication, according to an illustrative embodiment.

FIG. 11 is a cross sectional view of the semiconductor structure 100 at an eleventh-intermediate stage of fabrication. During this stage, MRAM cell protection layer 126 is selectively etched to remove a portion of MRAM cell protection layer 126 on cap layer 114 over the first set of metal-containing lines 108 and adjacent ILD layer 106, and leave MRAM cell protection layer 126 on the sidewalls of MRAM cells 122 and 124 and on the cap layer 114 disposed on bottom electrodes 118. For example, in some embodiments, a pattern (not shown) is produced on MRAM cell protection layer 126 by applying a photoresist to the surface to be etched; exposing the photoresist to a pattern of radiation; and then developing the pattern into the photoresist utilizing resist developer. The etch process can be any suitable etching process such as a dry etch, e.g. RIE, and any excess resist is removed.

Figure 12:
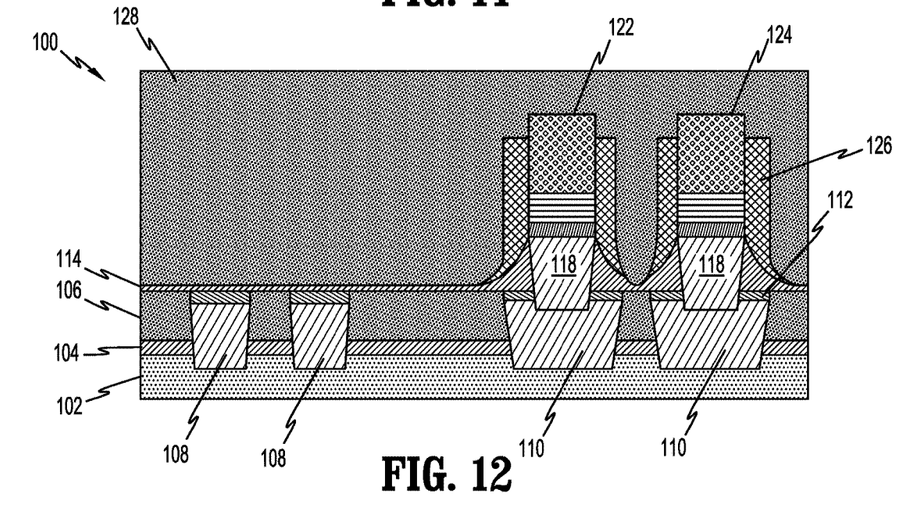
FIG. 12 is a schematic cross-sectional view of the semiconductor structure at a twelfth-intermediate stage of fabrication, according to an illustrative embodiment.

FIG. 12 is a cross sectional view of the semiconductor structure 100 at a twelfth-intermediate stage of fabrication. During this stage, an ILD layer 128 is deposited on cap layer 114 over the first set of metal-containing lines 108 and adjacent ILD layer 106, protection layer 126 and over a top surface of MRAM devices 122 and 124. ILD layer 128 can be formed from a similar material and of a similar deposition process as ILD layer 106.

Figure 13:
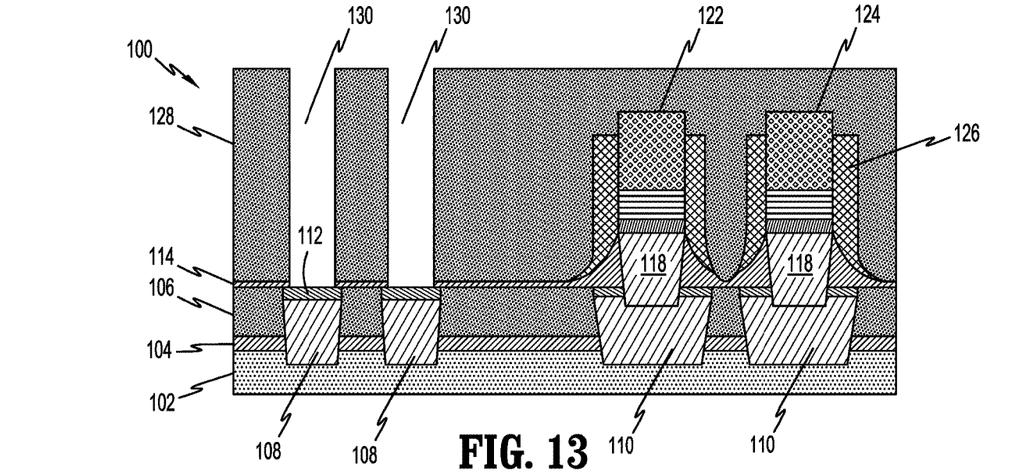
FIG. 13 is a schematic cross-sectional view of the semiconductor structure at a thirteenth-intermediate stage of fabrication, according to an illustrative embodiment.

FIG. 13 is a cross sectional view of the semiconductor structure 100 at a thirteenth-intermediate stage of fabrication. During this stage, vias 130 are formed in ILD layer 128, exposing a top surface of cap protection layer 112 over the first set of metal-containing lines 108. For example, in some embodiments, a pattern (not shown) is produced on ILD layer 128 by applying a photoresist to the surface to be etched; exposing the photoresist to a pattern of radiation; and then developing the pattern into the photoresist utilizing resist developer. The etch process can be a directional etching such as ME, and the excess resist from the lithography is stripped. The etching will form the vias 130 in ILD layer 128 and expose a portion of cap protection layer 112 on first set of metal-containing lines 108 in which cap layer 114 is removed.

Figure 14:
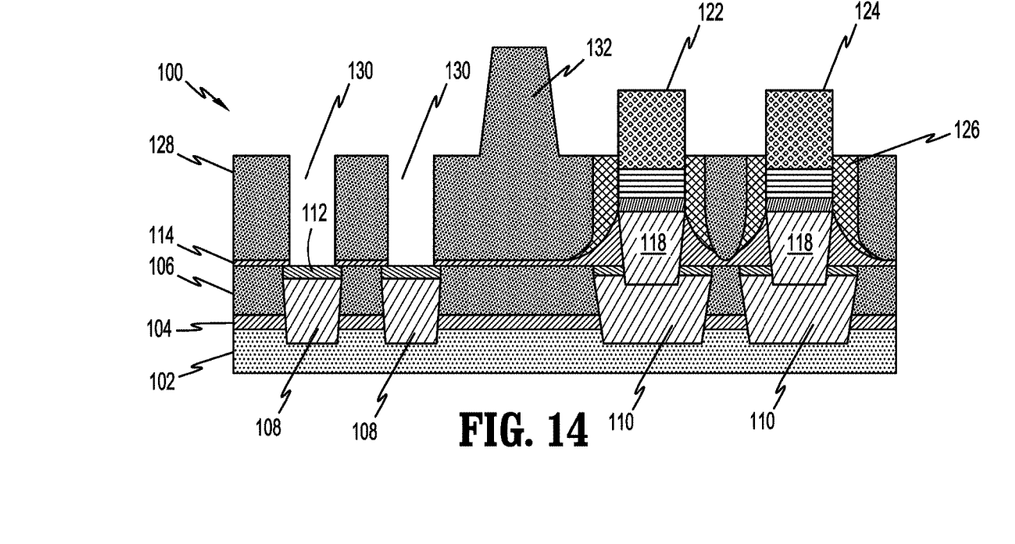
FIG. 14 is a schematic cross-sectional view of the semiconductor structure at a fourteenth-intermediate stage of fabrication, according to an illustrative embodiment.

FIG. 14 is a cross sectional view of the semiconductor structure 100 at a fourteenth-intermediate stage of fabrication. During this stage, ILD layer 128 is patterned and etched to, for example, a top surface of protection layer 126 that exposes a top surface of MRAM cells 122 and 124. A raised portion 132 in ILD layer 128 can be formed in the etching process. Although protection layer 126 is shown as coplanar with ILD layer 128, one skilled in the art will appreciate that ILD layer 128 can be patterned and etched either higher or lower than protection layer 126.

Figures 15, 16:
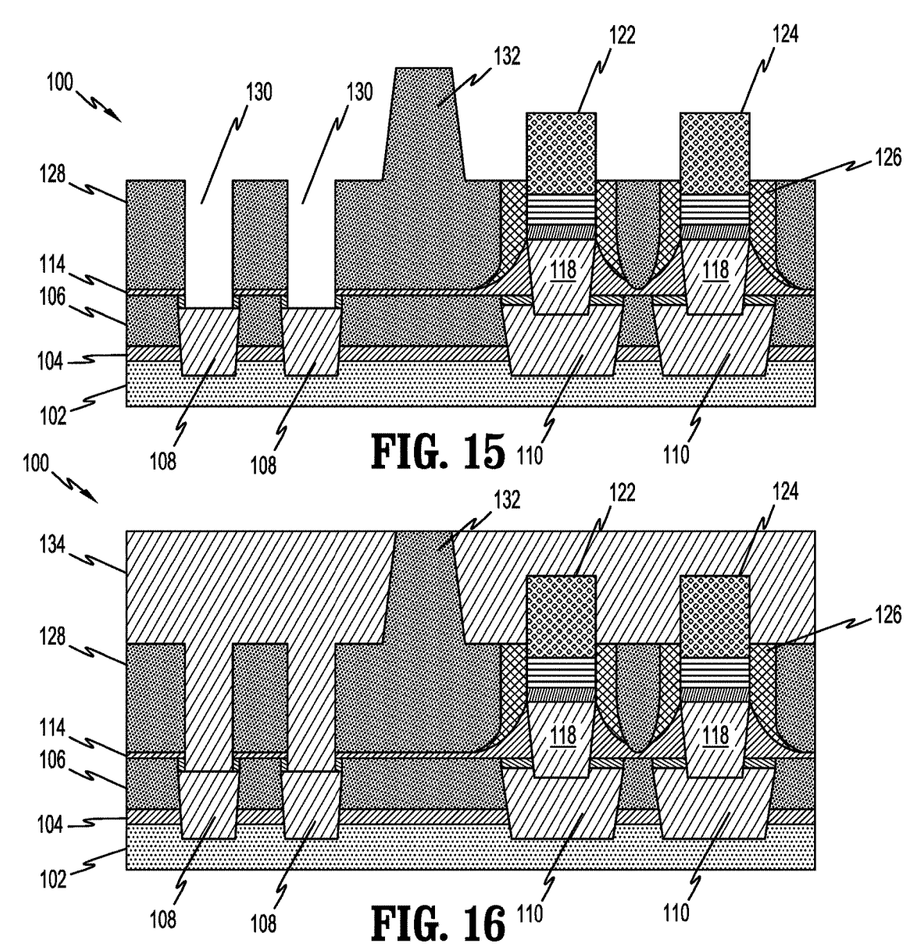
FIG. 15 is a schematic cross-sectional view of the semiconductor structure at a fifteenth-intermediate stage of fabrication, according to an alternative illustrative embodiment.
FIG. 16 is a schematic cross-sectional view of the semiconductor structure at a sixteenth-intermediate stage of fabrication, according to an illustrative embodiment.

FIG. 15 is a cross sectional view of the semiconductor structure 100 at an optional fifteenth-intermediate stage of fabrication. During this optional stage, the exposed cap protection layer 112 on first set of metal-containing lines 108 can be selectively etched to expose the top surface of first set of metal-containing lines 108. Cap protection layer 112 can be selectively etched using, for example, a suitable wet etching process.

FIG. 16 is a cross sectional view of the semiconductor structure 100 at a sixteenth-intermediate stage of fabrication. During this stage, a conductive material 134 is deposited in vias 130 and over ILD layer 128 and MRAM cells 122 and 124 using a suitable deposition process, for example, CVD, ALD, PVD, PECVD, or other like processes. Subsequently, any metal overburden is then planarized by, for example, a planarization process such as a CMP process so that the conductive material 134 is coplanar with vertical portion 132 of ILD layer 128. However, it is to be understood that conductive material 134 does not have to be coplanar with vertical portion 132 of ILD layer 128. A suitable conductive material can be any of those discussed above for first and second set of metal-containing lines 108 and 110. In one embodiment, conductive material 134 is the same material as in the first set of metal-containing lines 108.

It is to be understood that the methods discussed herein for fabricating metallic interconnect structures (e.g., BEOL interconnect structures) can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method, comprising:
    forming a first metallization layer comprising a first metal-containing line and a second metal-containing line in a first interlevel dielectric layer, wherein the first metal-containing line comprises a first conductive metal and the second metal-containing line comprises a second conductive metal;
    recessing the first metal-containing line and the second metal-containing line to below a top surface of the first interlevel dielectric layer;
    depositing a metal-containing cap protection layer on the recessed first metal-containing line and the recessed second metal-containing line;
    forming a cap layer on the first interlevel dielectric layer and the metal-containing cap protection layer; and
    forming a metal electrode in the cap layer and a portion of the metal-containing cap protection layer and on the recessed second metal-containing line;
    wherein the metal-containing cap protection layer comprises a third conductive metal different than the first conductive metal and the second conductive metal.

2. The method of claim 1,
    wherein forming a metal electrode in the cap layer and a portion of the metal-containing cap protection layer and the recessed second metal-containing line comprises:
    forming a first via in the cap layer and a portion of the metal-containing cap protection layer and exposing a portion of the recessed second metal-containing line; and
    depositing a fourth conductive metal in the first via.

3. The method of claim 2, further comprising:
    forming magnetic random-access memory cell forming layers on the cap layer and the fourth conductive metal in the first via; and
    patterning the magnetic random-access memory cell forming layers to form a magnetic random-access memory cell on the fourth conductive metal in the first via.

4. The method of claim 3, wherein patterning the magnetic random-access memory cell forming layers comprises an ion beam etching process to form the magnetic random-access memory cell.

5. The method of claim 3, wherein patterning the magnetic random-access memory cell forming layers further comprises recessing the cap layer to a first thickness on the metal-containing cap protection layer on the recessed first metal-containing line and adjacent interlevel dielectric layer and to a second thickness on the metal-containing cap protection layer on the recessed second metal-containing line and sidewalls of the fourth conductive metal in the first via, wherein the first thickness is less than the second thickness.

6. The method of claim 5, further comprising:
    forming a magnetic random-access memory cell protection layer on a portion of sidewalls of the magnetic random-access memory cell and on the cap layer on the sidewalls of the fourth conductive metal in the first via;
    forming a second interlevel dielectric layer on the cap layer, the magnetic random-access memory cell protection layer and over the magnetic random-access memory cell;
    forming a second via in the second interlevel dielectric layer and the cap layer and exposing a portion of the metal-containing cap protection layer on the recessed first metal-containing line;

recessing the second interlevel dielectric layer to below a top portion of the magnetic random-access memory cell and exposing a top surface of the magnetic random-access memory cell protection layer; and depositing a fifth conductive metal in the second via.

7. The method of claim 6, further comprising removing the exposed metal-containing cap protection layer on the recessed first metal-containing line prior to depositing the fifth conductive metal in the second via.

8. The method of claim 1, wherein the first conductive metal and the second conductive metal are the same conductive metal.

9. The method of claim 1, wherein forming a metal electrode in the cap layer and a portion of the metal-containing cap protection layer and the recessed second metal-containing line comprises:

forming a first via in the cap layer and exposing a portion of the metal-containing cap protection layer on the recessed second metal-containing line;

removing the exposed portion of the metal-containing cap protection layer; and depositing the fourth conductive metal in the first via.

10. The method of claim 9, further comprising:

forming magnetic random-access memory cell forming layers on the cap layer and the fourth conductive metal in the first via; and patterning the magnetic random-access memory cell forming layer to form a magnetic random-access memory cell on the fourth conductive metal in the first via.

11. The method of claim 10, wherein patterning the magnetic random-access memory cell forming layers comprises an ion beam etching process to form the magnetic random-access memory cell.

12. The method of claim 10, wherein patterning the magnetic random-access memory cell forming layers further comprises recessing the cap layer to a first thickness on the metal-containing cap protection layer on the recessed first metal-containing line and adjacent interlevel dielectric layer and to a second thickness on the metal-containing cap protection layer on the recessed second metal-containing line and sidewalls of the fourth conductive metal in the first via, wherein the first thickness is less than the second thickness.

13. The method of claim 12, further comprising:

forming a magnetic random-access memory cell protection layer on a portion of sidewalls of the magnetic random-access memory cell and on the cap layer on the sidewalls of the fourth conductive metal in the first via;

forming a second interlevel dielectric layer on the cap layer, the magnetic random-access memory cell protection layer and over the magnetic random-access memory cell;

forming a second via in the second interlevel dielectric layer and the cap layer and exposing a portion of the metal-containing cap protection layer on the recessed first metal-containing line;

recessing the second interlevel dielectric layer to below a top portion of the magnetic random-access memory cell and exposing a top surface of the magnetic random-access memory cell protection layer; and depositing a fifth conductive metal in the second via.

14. The method of claim 13, further comprising removing the exposed metal-containing cap protection layer on the recessed first metal-containing line prior to depositing the fifth conductive metal in the second via.

15. The method of claim 13, wherein the first conductive metal, the second conductive metal, the fourth conductive metal and the fifth conductive metal are the same conductive metal.

16. The method of claim 15, wherein the first conductive metal, the second conductive metal, the fourth conductive metal and the fifth conductive metal are copper.

17. A semiconductor structure, comprising:

a first metallization layer comprising a recessed first metal-containing line and a recessed second metal-containing line disposed in a first interlevel dielectric layer, wherein the first metal-containing line comprises a first conductive metal and the second metal-containing line comprises a second conductive metal;

a metal-containing cap protection layer disposed on the recessed first metal-containing line and a portion of the recessed second metal-containing line;

a cap layer disposed on the first interlevel dielectric layer and the metal-containing cap protection layer; and a metal electrode disposed in the cap layer and the metal-containing cap protection layer and on the recessed second metal-containing line;

wherein the metal-containing cap protection layer comprises a third conductive metal different than the first conductive metal and the second conductive metal.

18. The semiconductor structure of claim 17, further comprising:

a magnetic random-access memory cell disposed on the metal electrode;

a magnetic random-access memory cell protection layer disposed on a portion of sidewalls of the magnetic random-access memory cell and on the cap layer disposed on sidewalls of the metal electrode;

a second interlevel dielectric layer disposed on the cap layer;

a via disposed in the second interlevel dielectric layer and a portion of the metal-containing cap protection layer and over the recessed first metal-containing line; and a fourth conductive metal disposed in the via and over the magnetic random-access memory cell.

19. An integrated circuit, comprising:

one or more semiconductor structures, wherein at least one of the semiconductor structures comprises:

a first metallization layer comprising a recessed first metal-containing line and a recessed second metal-containing line disposed in a first interlevel dielectric layer, wherein the first metal-containing line comprises a first conductive metal and the second metal-containing line comprises a second conductive metal;

a metal-containing cap protection layer disposed on the recessed first metal-containing line and a portion of the recessed second metal-containing line;

a cap layer disposed on the first interlevel dielectric layer and the metal-containing cap protection layer; and a metal electrode disposed in the cap layer and the metal-containing cap protection layer and on the recessed second metal-containing line;

wherein the metal-containing cap protection layer comprises a third conductive metal different than the first conductive metal and the second conductive metal.

20. The integrated circuit of claim 19, further comprising:

a magnetic random-access memory cell disposed on the metal electrode;

a magnetic random-access memory cell protection layer disposed on a portion of sidewalls of the magnetic random-access memory cell and on the cap layer disposed on the sidewalls of the metal electrode;
a second interlevel dielectric layer disposed on the cap layer;
a via disposed in the second interlevel dielectric layer and a portion of the metal-containing cap protection layer and over the recessed first metal-containing line; and
a fourth conductive metal disposed in the via and over the magnetic random-access memory cell.

* * * * *